United States Patent
Kuehnle et al.

(10) Patent No.: US 7,410,914 B2
(45) Date of Patent: Aug. 12, 2008

(54) PROCESS FOR PRODUCING LOW-K DIELECTRIC FILMS

(75) Inventors: Adolf Kuehnle, Marl (DE); Carsten Jost, Duesseldorf (DE); Hartwig Rauleder, Rheinfelden (DE); Come Rentrop, Eindhoven (NL); Roelant Van Dam, Maastricht (NL); Klaas Timmer, Bilthoven (NL); Hartmut Fischer, Mierlo (NL)

(73) Assignee: Degussa AG, Duesseldorf (DE)

( * ) Notice: Subject to any disclaimer, the term of this patent is extended or adjusted under 35 U.S.C. 154(b) by 0 days.

(21) Appl. No.: 10/563,450

(22) PCT Filed: Jun. 2, 2004

(86) PCT No.: PCT/EP2004/050989
§ 371 (c)(1),
(2), (4) Date: Apr. 14, 2006

(87) PCT Pub. No.: WO2005/004220
PCT Pub. Date: Jan. 13, 2005

(65) Prior Publication Data
US 2007/0166456 A1 Jul. 19, 2007

(30) Foreign Application Priority Data
Jul. 3, 2003 (DE) .................. 103 30 022

(51) Int. Cl.
*H01L 21/00* (2006.01)
(52) U.S. Cl. ............ 438/780; 438/758; 257/E21.261
(58) Field of Classification Search .......... 438/758, 438/780, 782, 789–790
See application file for complete search history.

(56) References Cited

U.S. PATENT DOCUMENTS

| | | | |
|---|---|---|---|
| 4,349,609 | A | 9/1982 | Takeda et al. |
| 5,152,834 | A | 10/1992 | Allman |
| 6,015,457 | A | 1/2000 | Leung et al. |
| 6,231,989 | B1 * | 5/2001 | Chung et al. ........ 428/447 |
| 6,695,904 | B2 | 2/2004 | Burger et al. |
| 2002/0127415 | A1 | 9/2002 | Standke et al. |
| 2002/0137625 | A1 | 9/2002 | Jost et al. |
| 2003/0055193 | A1 * | 3/2003 | Lichtenhan et al. ...... 528/10 |
| 2003/0096934 | A1 | 5/2003 | Jost et al. |
| 2005/0010012 | A1 | 1/2005 | Jost et al. |

FOREIGN PATENT DOCUMENTS

| | | |
|---|---|---|
| EP | 1 003 210 | 5/2000 |
| EP | 1 197 998 | 4/2002 |
| EP | 1 271 634 | 1/2003 |
| WO | WO03/042223 A1 * | 5/2003 |
| WO | WO 03/042223 A1 * | 5/2003 |

OTHER PUBLICATIONS

Huang, Q. R. et al., "Structure and Interaction of Organic/Inorganic Hybrid Nanocomposites for Microelectronic Applications. 1. MSSQ/P (MMA-co-DMAEMA) Nanocomposites", Chemistry of materials American Chemical Society USA, vol. 14, No. 9, pp. 3676-3685, 2002.
Pan, Qi et al., "Spin-on-glass thin films prepared from a novel polysilsesquioxane by thermal and ultraviolet-irradiation methods", Thin Solid Films, vol. 345, No. 2, pp. 244-254, 1999.
Provatas, A. et al., "Silsesquioxanes: Synthesis and Applications", Trends in Polymer Science, Elsevier Science Ltd., vol. 5, No. 10, pp. 327-332, 1997.
Mantz, R. A. et al., "Thermolysis of Polyhedral Oligomeric Silsesquioxane (POSS) Macromers and POSS-Siloxane Copolymers", Chemistry of materials, American Chemical Society, vol. 8, No. 6, pp. 1250-1259, 1996.
U.S. Appl. No. 10/563,450, filed Jan. 3, 2006, Kuehnle et al.
U.S. Appl. No. 10/511,593, filed Jun. 21, 2005, Kuehnle et al.
U.S. Appl. No. 10/005,108, filed Dec. 7, 2001, Jost et al.
U.S. Appl. No. 10/563,450, filed Apr. 14, 2006, Kuehnle et al.
U.S. Appl. No. 10/586,675, filed Jul. 20, 2006, Mueh et al.

* cited by examiner

*Primary Examiner*—Scott B. Geyer
*Assistant Examiner*—Reema Patel
(74) *Attorney, Agent, or Firm*—Oblon, Spivak, McClelland, Maier & Neustadt, P.C.

(57) ABSTRACT

The invention relates to processes for producing low-k dielectric films on semiconductors or electrical circuits, which comprises using incompletely condensed polyhedral oligomeric silsesquioxanes of the formula $[(R_aX_bSiO_{1.5})_m(R_cY_dSiO)_n]$ with: a, b=0-1; c, d=1; m+n≧3; a+b=1; n, m≧1, R=hydrogen atom or alkyl, cycloalkyl, alkenyl, cycloalkenyl, alkynyl, cycloalkynyl, aryl or heteroaryl group, in each case substituted or unsubstituted, X=an oxy, hydroxyl, alkoxy, carboxyl, silyl, silyloxy, halogen, epoxy, ester, fluoroalkyl, isocyanate, acrylate, methacrylate, nitrile, amino or phosphine group or substituents of type R containing at least one such group of type X, Y=hydroxyl, alkoxy or a substituent of type $O\text{—}SiZ_1Z_2Z_3$, where $Z_1$, $Z_2$ and $Z_3$ are fluoroalkyl, alkoxy, silyloxy, epoxy, ester, acrylate, methacrylate or a nitrile group or substituents of type R and are identical or different, not only the substituents of type R being identical or different but also the substituents of type X and Y in each case being identical or different, and comprising at least one hydroxyl group as substituent of type Y, for producing the film, and to low-k dielectric films produced by this process.

23 Claims, No Drawings

PROCESS FOR PRODUCING LOW-K DIELECTRIC FILMS

The invention relates to a process for producing low-k dielectric films on semiconductors for electrical circuits, and to the low-k dielectric films produced by said process.

The progress in semiconductor technology in tandem with increasing miniaturization is leading to an increasing demand for dielectric films having a k value of less than 3.0, referred to as low-k dielectric films. The k value is a measure of the electrical permittivity of a material. Dielectric films are used for insulating the metallic conductors and contribute to the RC time delay and hence to increasing the speed in signal transmission. The RC time delay is a measure of the extent of signal propagation in the conductor tracks, which is slowed by the environment of the conductor tracks, as a result for example of interaction with adjacent conductor tracks; this is referred to as crosstalk. The poorer the insulating layer, the greater the unwanted crosstalk. In addition to lowering the resistance R by going over to copper as conductor material, reducing the capacitance C through the use of insulating layers with low k values is a further means of increasing the performance of the processors. Through the use of low-k dielectric films it is likewise possible to reduce the RC time delay and hence the crosstalk between adjacent conductor tracks.

In addition to a low k value, the low-k dielectric films must have further properties in order to be useful as a component for chip fabrication. For instance, the low-k dielectric films must exhibit only low thermal expansion at elevated temperature. They ought additionally exhibit effective adhesion to metals, metal oxides and/or metal nitrides. In addition they ought to feature high mechanical stability and be suitable for the operations of planarization (CMP) and etching.

To date, silicon dioxide ($SiO_2$) has been the material of choice for producing dielectric films. The $SiO_2$ films are produced by depositing silane or siloxane precursors in an oxidizing environment by the CVD (chemical vapor deposition) process. The low-k dielectric films obtainable by this means have relatively high k values of more than 4.0.

For low-k dielectric films having a k value of from 2.6 to 3.5 the semiconductor industry has developed a number of materials, organic, inorganic and hybrid in nature. These low-k dielectric films can be deposited by means of a CVD process or by means of a SOD (spin-on deposition) process. Newer materials for low-k dielectric films, such as fluorosilicate glasses or carbon-doped $SiO_2$, can be deposited by means of a CVD process. Low-k dielectric films made from polyimides, polyaryl ethers or polysilsesquioxanes (HSQ) can be produced by means of an SOD process.

Patent application U.S. Ser. No. 2002/0192980 describes the use of completely condensed oligomeric silsesquioxanes for producing low-k dielectric films by a CVD process. Functionalized polyhedral oligomeric silsesquioxanes are reacted with a crosslinker to produce a film structure having a k value of 2.6 or less. The crosslinker used is preferably a silane or siloxane. Crosslinking takes place by free-radical polymerization initiated by silyl or peroxy radicals.

Lercher et al. (Adv. Mater. 14 (2002), 1369-73) describe the preparation of low-k dielectric films by reaction of oligomeric silsesquioxanes or spherosilicates with suitable crosslinking reagents. In one instance hydrosilylation was used to react Si—H-substituted, completely condensed cuboid silsesquioxanes or spherosilicates with 1,5-hexadiene. In another instance hydrolytic condensation was used to react $Si(OEt)_3$-substituted, completely condensed, cuboid silsesquioxanes or spherosilicates with water to form a three-dimensional network. The layers applied by the SOD process have a k value of from 2.1 to 2.7. A similar approach is pursued by patent application EP 1 036 808, wherein the desired low-k dielectric films are obtained by hydrosilylating Si—H-substituted, cuboid silsesquioxanes with divinyl-terminated coreactants.

JP 2001189109 describes the production of low-k dielectric films having a k value of 2.5 from polybenzoxazoles or precursors thereof and functionalized cuboid oligomeric silsesquioxanes.

Patent U.S. Pat. No. 6,329,490 describes the use of completely condensed oligomer silsesquioxanes having fluorinated alkyl radicals for producing low-k dielectric films.

The deposition of fluorosilsesquioxane films by a CVD process is described by patent application WO 01/29141. These films are produced using as precursors mixtures of silsesquioxanes comprising hydrogen and/or fluorine substituents.

Use of oligomeric silsesquioxanes of type $H_8Si_8O_{12}$ for producing low-k dielectric films is described in patent application EP 0 962 965.

It was an object of the present invention to provide a process for producing low-K dielectric films that allows more favorably priced or more readily available silsesquioxane raw materials to be used than in prior art processes. In particular it was an object to provide a process enabling low-k dielectric films of virtually the same quality to be produced for lower raw materials costs.

Surprisingly it has been found that through the use of the readily available, more favorably priced, incompletely condensed polyhedral oligomeric silsesquioxanes it is possible to produce low-k dielectric films which have a k value of less than or equal to 2.5 as measured at a frequency of 880 kHz. The achievement of object was all the more surprising since it was found that in the reaction of the incompletely condensed polyhedral oligomeric silsesquioxanes with alkoxysilanes a three-dimensional structure is formed which following calcination constitutes ideal insulation materials.

The present invention accordingly provides a process for producing low-k dielectric films on semiconductors or electrical circuits which comprises using incompletely condensed polyhedral oligomeric silsesquioxanes of the formula

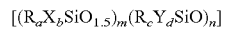

with:
- a, b=0-1; c, d=1; m+n≧3; a+b=1; n, m≧1,
- R=hydrogen atom or alkyl, cycloalkyl, alkenyl, cycloalkenyl, alkynyl, cycloalkynyl, aryl or heteroaryl group, in each case substituted or unsubstituted,
- X=an oxy, hydroxyl, alkoxy, carboxyl, silyl, silyloxy, halogen, epoxy, ester, fluoroalkyl, isocyanate, acrylate, methacrylate, nitrile, amino or phosphine group or substituents of type R containing at least one such group of type X,
- Y=hydroxyl, alkoxy or a substituent of type O—$SiZ_1Z_2Z_3$, where $Z_1$, $Z_2$ and $Z_3$ are fluoroalkyl, alkoxy, silyloxy, epoxy, ester, acrylate, methacrylate or a nitrile group or substituents of type R and are identical or different, not only the substituents of type R being identical or different but also the substituents of type X and Y in each case being identical or different, and comprising at least one hydroxyl group as substituent of type Y, for producing the film.

This invention further provides low-k dielectric films produced by the process of the invention.

The present invention has the advantage over the prior art processes that, with incompletely condensed polyhedral oligomeric silsesquioxanes, favorably priced, readily available reagents are employed which distinctly enhance the economics of the production process. The afore-described processes for producing low-k dielectric films in accordance with the art are characterized by the use of expensive polyhedral oligomeric silsesquioxanes, which in the majority of cases are poorly available and must be prepared in complex fashion by way of multistage syntheses. Incomplete condensed silsesquioxanes of structure 1, in contrast, can be prepared in a one-stage synthesis by hydrolytic condensation of the trialkoxysilanes RSi(OR')$_3$ in very good yields. Simple monosilylation of the compounds of structure 1 produced incompletely condensed polyhedral oligomeric silsesquioxanes of structure 2. Incompletely condensed polyhedral oligomeric silsesquioxanes of structures 1 and 2 are therefore among the readily available, favorably priced representatives of the class of substance of the oligomeric silsesquioxanes. By reacting these incompletely condensed polyhedral oligomeric silsesquioxanes with further coreactants capable of hydrolytic condensation (such as alkoxysilanes) it is possible to obtain new kinds of three-dimensional network structures which are suitable directly or following calcination as porous low-k dielectric films.

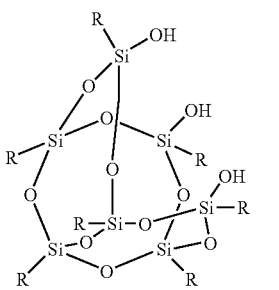

1

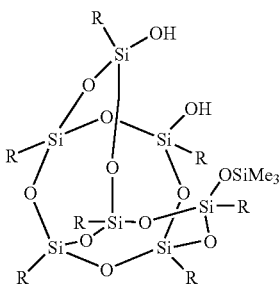

2

A further advantage of the process of the invention is that through the choice of the incompletely condensed polyhedral oligomeric silsesquioxanes and of the coreactant capable of hydrolytic condensation it is possible to adjust the porosity and hence also k values of the low-k dielectric film. Thermomechanical strength, hardness, moduli, thermal stability and surface roughness are likewise dependent on the precursors used.

The process of the invention for producing low-k dielectric films on semiconductors or electrical circuits is distinguished through the use of incompletely condensed polyhedral oligomeric silsesquioxanes of the formula $$[(R_aX_bSiO_{1.5})_m(R_cY_dSiO)_n]$$

with:

a, b=0-1; c, d=1; m+n≧3; a+b=1; n, m≧1,

R=hydrogen atom or alkyl, cycloalkyl, alkenyl, cycloalkenyl, alkynyl, cycloalkynyl, aryl or heteroaryl group, in each case substituted or unsubstituted, X=an oxy, hydroxyl, alkoxy, carboxyl, silyl, silyloxy, halogen, epoxy, ester, fluoroalkyl, isocyanate, acrylate, methacrylate, nitrile, amino or phosphine group or substituents of type R containing at least one such group of type X, Y=hydroxyl, alkoxy or a substituent of type O—SiZ$_1$Z$_2$Z$_3$, where Z$_1$, Z$_2$ and Z$_3$ are fluoroalkyl, alkoxy, silyloxy, epoxy, ester, acrylate, methacrylate or a nitrile group or substituents of type R and are identical or different, not only the substituents of type R being identical or different but also the substituents of type X and Y in each case being identical or different, and comprising at least one hydroxyl group as substituent of type Y, for producing the film.

In the process of the invention it is preferred to use incompletely condensed polyhedral oligomeric silsesquioxanes containing not more than three hydroxyl groups as type Y substituents. Use is made in particular in the process of the invention of incompletely condensed polyhedral oligomeric silsesquioxanes of the formula $$[(R_aSiO_{1.5})_m(R_cY_dSiO)_n]$$

with:

a, c, d=1; m+n≧3; n, m≧1,

R=hydrogen atom or alkyl, cycloalkyl, alkenyl, cycloalkenyl, alkynyl, cycloalkynyl, aryl or heteroaryl group, in each case substituted or unsubstituted, Y=hydroxyl, alkoxy or a substituent of type O—SiZ$_1$Z$_2$Z$_3$, where Z$_1$, Z$_2$ and Z$_3$ are fluoroalkyl, alkoxy, silyloxy, epoxy, ester, acrylate, methacrylate or a nitrile group or substituents of type R and are identical or different, not only the substituents of type R being identical or different but also the substituents of type Y in each case being identical or different, and comprising at least one hydroxyl group as substituent of type Y.

Preferably, however, incompletely condensed polyhedral oligomeric silsesquioxanes of structure 1 or 2 are used.

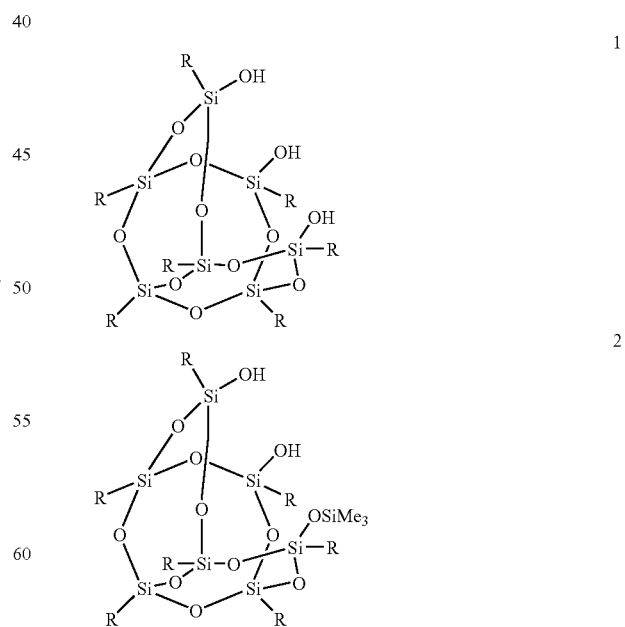

With particular preference the incompletely condensed polyhedral oligomeric silsesquioxanes used in the process of the invention contain a hydrogen atom or an alkyl, cycloalkyl or alkenyl group as type R substituent. With very particular preference the incompletely condensed polyhedral oligomeric silsesquioxanes used comprise as substituent of type R an alkyl group, in particular a methyl, ethyl, propyl, isobutyl, n-octyl or isooctyl or a 2,2,4-trimethylpentyl group. In one particular embodiment of the process of the invention the incompletely condensed polyhedral oligomeric silsesquioxanes used comprise as substituent of type R a phenyl, cyclopentyl or cyclohexyl group. The substituents of type R may all be identical, though it is also possible for the incompletely condensed polyhedral oligomeric silsesquioxanes to comprise different substituents of type R.

In accordance with the process of the invention the incompletely condensed polyhedral oligomeric silsesquioxanes can be used either as the substance per se or in solution. Suitable solvents preferably include, in addition to water, organic solvents, particularly alcohols, ketones, ethers, alkanes, cycloalkanes, arenes, nitriles, amines, sulfides, esters, carboxylic acids, amides or unsaturated and halogenated hydrocarbons. Particularly suitable solvents are alcohols, with 1-methoxy-2-propanol being of very special suitability.

In one particular embodiment of the process of the invention the incompletely condensed polyhedral oligomeric silsesquioxanes are reacted together with coreactants capable of hydrolytic condensation, preferably with alkoxysilanes, more preferably with tetraalkoxysilanes and very preferably with tetraethoxysilane. In this reaction the molar ratio of the incompletely condensed polyhedral oligomeric silsesquioxanes to the coreactant capable of hydrolytic condensation is preferably from 1:100 to 100:1, more preferably from 1:10 to 10:1 and very preferably 1:2.

In one very special embodiment of the process of the invention the coreactants capable of hydrolytic condensation are prehydrolyzed or part-hydrolyzed prior to the reaction with the incompletely condensed polyhedral oligomeric silsesquioxanes. This prior or partial hydrolysis of the coreactants capable of hydrolytic condensation can take place either in acidic solution or in neutral solution, and takes place preferably in acidic solution. For this purpose the coreactants capable of hydrolytic condensation are reacted preferably with water. In one particular embodiment, for this prior or partial hydrolysis, 50% of the molar amount of water required arithmetically for complete hydrolysis of the coreactant capable of hydrolytic condensation is added.

In another embodiment of the process of the invention a film former, preferably a saturated hydrocarbon, more preferably a saturated hydrocarbon having 10, 11, 12, 13, 14, 15, 16, 17, 18, 19 or 20 carbon atoms, very preferably hexadecane, is added to the incompletely condensed polyhedral oligomeric silsesquioxane. In one special embodiment of the process of the invention it is also possible to use a pore former.

Deposition of the starting materials on the substrate, which may be a semiconductor or a circuit, takes place preferably by means of a wet-chemical coating method, more preferably by means of spin coating, very preferably at room temperature. In one particular embodiment the deposition may also take place by means of dip coating. This is followed preferably by calcining, in particular at from 400 to 500° C.

The invention further provides low-k dielectric films produced by the process of the invention. The low-k dielectric films of the invention preferably have a k value—permittivity—of less than or equal to 2.5, more preferably less than or equal to 2.3 and very preferably less than or equal to 2.1, measured at a frequency of 880 kHz. The k value is determined by a method analogous to that of A. R. Blythe, Electrical Properties of Polymers, Cambridge University Press, ISBN 0 521 29825 3.

The example which follows is intended to illustrate the process of the invention, without any intention that the invention should be limited to this embodiment.

1. Prehydrolysis of the Coreactant Capable of Hydrolytic Condensation

For prehydrolysis of tetraethoxysilane, tetraethoxysilane and water are reacted in a molar ratio of 1:2 (50 g of tetraethoxysilane and 8.65 g of water) at a pH of 2, which is set by adding hydrochloric acid. For this reaction the reaction mixture is stirred at room temperature for about 1 day until a clear solution has formed.

2. Preparation of the Starting Material Mixture

20% by weight of an incompletely condensed polyhedral oligomeric silsesquioxane is dissolved in 1-methoxy-2-propanol. Subsequently 10% by weight of hexadecane are added to this solution. In a further step the prehydrolysis product from step 1 is added at room temperature to the solution of the incompletely condensed polyhedral oligomeric silsesquioxane, the molar ratio of tetraethoxysilane to the incompletely condensed polyhedral oligomeric silsesquioxane being 2:1.

TABLE 1

| | Experimental parameters relating to the preparation of the starting material mixture | |
|---|---|---|
| Example | Incompletely condensed polyhedral oligomeric silsesquioxane in accordance with structure | |
| 2.1 | 1 with R = isobutyl[1.] | |
| 2.2 | 2 with R = isobutyl[2.] | |

[1.]purchased from Sigma-Aldrich
[2.]prepared by silylation using trimethylsilyl chloride and the incompletely condensed polyhedral oligomeric silsesquioxane of structure 1.

3. Deposition of the Starting Material Mixture 0.5 ml of each of the starting material mixtures from step 2 is deposited by spin coating on a substrate having a surface area of 6.45 cm$^2$ and rotating at a speed of 1200 rpm over the course of 2 minutes. Subsequently the coated substrates are dried initially at room temperature and then calcined at 450° C. in an air atmosphere over the course of 1 hour.

| Example | Starting material mixture | Substrate |
|---|---|---|
| 3.1 | 2.1 | glass |
| 3.2 | 2.2 | glass |
| 3.3 | 2.2 | conductive glass coated with indium tin oxide (ITO), having a surface resistance of 10 ohms |

4. Characterization of the Inventive Low-k Dielectric Films

The low-k dielectric films prepared in accordance with example 3.1 and 3.2 exhibit good transparency and wetting. The low-k dielectric films produced according to example 3.3 have a thickness of 550 nm. After the coating has been calcined, a gold electrode with a layer thickness of 100 to 500 nm is deposited thereon by means of physical vapor deposition. A measurement is then made of the admittance as a function of frequency at room temperature, using a precision LCR meter HP 4284A. At a frequency f of 880 kHz the k value is 2.3.

What is claimed is:

1. A process for producing a low-k dielectric film deposited on a substrate, wherein said process comprises:

coating said substrate with a solution comprising an incompletely condensed polyhedral oligomeric silsesquioxane according to structural formula (1) or (2):

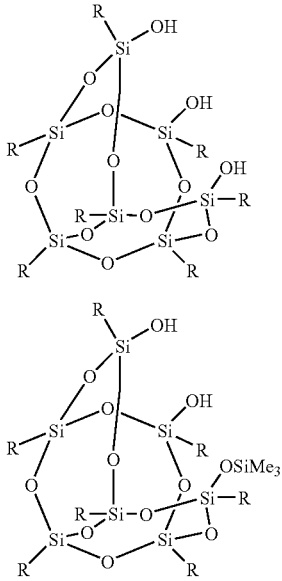

to produce said low-k dielectric film deposited on said substrate,
wherein each R is independently selected from the group consisting of a hydrogen atom or a substituted or unsubstituted alkyl, cycloalkyl, alkenyl, cycloalkenyl, alkynyl, cycloalkynyl, aryl, or heteroaryl group.

2. The process for producing a low-k dielectric film deposited on a substrate according to claim 1, wherein said coating is selected from spin coating and dip coating.

3. The process for producing a low-k dielectric film deposited on a substrate according to claim 1, wherein said process further comprises drying said low-k dielectric film deposited on said substrate.

4. The process for producing a low-k dielectric film deposited on a substrate according to claim 3, wherein said drying is carried out at room temperature.

5. The process for producing a low-k dielectric film deposited on a substrate according to claim 1, wherein said process further comprises calcining said low-k dielectric film deposited on said substrate.

6. The process for producing a low-k dielectric film deposited on a substrate according to claim 5, wherein said calcining is carried out at a temperature ranging from 400° C. to 500° C.

7. The process for producing a low-k dielectric film deposited on a substrate according to claim 1, wherein said solution further comprises a co-reactant capable of hydrolytic condensation, and wherein said process further comprises reacting said incompletely condensed polyhedral oligomeric silsesquioxane with said co-reactant capable of hydrolytic condensation.

8. The process for producing a low-k dielectric film deposited on a substrate according to claim 7, wherein said process further comprises prehydrolyzing said co-reactant capable of hydrolytic condensation prior to reacting with said incompletely condensed polyhedral oligomeric silsesquioxane.

9. The process for producing a low-k dielectric film deposited on a substrate according to claim 8, wherein said prehydrolyzing occurs under aqueous acidic or aqueous neutral conditions.

10. The process for producing a low-k dielectric film deposited on a substrate according to claim 7, wherein said co-reactant capable of hydrolytic condensation is an alkoxysilane.

11. The process for producing a low-k dielectric film deposited on a substrate according to claim 10, wherein said alkoxysilane is a tetraalkoxysilane.

12. The process for producing a low-k dielectric film deposited on a substrate according to claim 7, wherein the molar ratio of said incompletely condensed polyhedral oligomeric silsesquioxane to said co-reactant capable of hydrolytic condensation is from 1:100 to 100:1.

13. The process for producing a low-k dielectric film deposited on a substrate according to claim 7, wherein the molar ratio of said incompletely condensed polyhedral oligomeric silsesquioxane to said co-reactant capable of hydrolytic condensation is from 1:10 to 10:1.

14. The process for producing a low-k dielectric film deposited on a substrate according to claim 7, wherein the molar ratio of said incompletely condensed polyhedral oligomeric silsesquioxane to said co-reactant capable of hydrolytic condensation is from 1:2 to 2:1.

15. The process for producing a low-k dielectric film deposited on a substrate according to claim 1, wherein said solution further comprises a solvent selected from water, an organic solvent, or a mixture thereof.

16. The process for producing a low-k dielectric film deposited on a substrate according to claim 15, wherein said solvent comprises an organic solvent selected from an alcohol, a ketone, an ether, an alkane, a cycloalkane, an arene, a nitrile, an amine, a sulfide, an ester, a carboxylic acid, an amide, an unsaturated hydrocarbon, and a halogenated hydrocarbon.

17. The process for producing a low-k dielectric film deposited on a substrate according to claim 15, wherein said solvent comprises 1-methoxy-2-propanol.

18. The process for producing a low-k dielectric film deposited on a substrate according to claim 1, wherein said solution further comprises a film former comprising a saturated hydrocarbon having from 10 to 20 carbon atoms.

19. The process for producing a low-k dielectric film deposited on a substrate according to claim 18, wherein said solution further comprises a film former comprising hexadecane.

20. The process for producing a low-k dielectric film deposited on a substrate according to claim 1, wherein said substrate is selected from a semiconductor, an electrical circuit, and a conductive glass.

21. The process for producing a low-k dielectric film deposited on a substrate according to claim 1, wherein said low-k dielectric film deposited on said substrate has a k value of less than or equal to 2.5 when measured at a frequency of 880 kHz.

22. The process for producing a low-k dielectric film deposited on a substrate according to claim 1, wherein said low-k dielectric film deposited on said substrate has a k value of less than or equal to 2.3 when measured at a frequency of 880 kHz.

23. The process for producing a low-k dielectric film deposited on a substrate according to claim 1, wherein said low-k dielectric film deposited on said substrate has a k value of less than or equal to 2.1 when measured at a frequency of 880 kHz.

* * * * *

UNITED STATES PATENT AND TRADEMARK OFFICE
CERTIFICATE OF CORRECTION

PATENT NO. : 7,410,914 B2  Page 1 of 1
APPLICATION NO. : 10/563450
DATED : August 12, 2008
INVENTOR(S) : Kuehnle et al.

It is certified that error appears in the above-identified patent and that said Letters Patent is hereby corrected as shown below:

On the title page, Item (75), the Inventor information is incorrect. Item (75) should read:

-- (75) Inventors: Adolf Kuehnle, Marl (DE); Carsten Jost, Duesseldorf (DE); Hartwig Rauleder, Rheinfelden (DE); Corne Rentrop, Eindhoven (NL); Roelant Van Dam, Maastricht (NL); Klaas Timmer, Bilthoven (NL); Hartmut Fischer, Mierlo (NL) --

Signed and Sealed this

Seventh Day of October, 2008

JON W. DUDAS
*Director of the United States Patent and Trademark Office*